United States Patent
Lochman et al.

(10) Patent No.: US 11,769,986 B2
(45) Date of Patent: *Sep. 26, 2023

(54) SILOXANE MITIGATION FOR LASER SYSTEMS

(71) Applicant: PANASONIC INTELLECTUAL PROPERTY MANAGEMENT CO., LTD., Osaka (JP)

(72) Inventors: Bryan Lochman, Nashville, TN (US); Wang-Long Zhou, Andover, MA (US); Francisco Villarreal-Saucedo, Middleton, MA (US); Bien Chann, Merrimack, NH (US)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/867,941

(22) Filed: Jul. 19, 2022

(65) Prior Publication Data
US 2022/0352689 A1 Nov. 3, 2022

Related U.S. Application Data

(63) Continuation of application No. 17/071,205, filed on Oct. 15, 2020, now Pat. No. 11,424,592.
(Continued)

(51) Int. Cl.
*H01S 5/02235* (2021.01)
*H01S 5/40* (2006.01)
(Continued)

(52) U.S. Cl.
CPC ........ *H01S 5/02235* (2021.01); *H01S 5/0222* (2013.01); *H01S 5/02423* (2013.01);
(Continued)

(58) Field of Classification Search
CPC .............. H01S 5/02235; H01S 5/0222; H01S 5/02423; H01S 5/4012; H01S 5/4025;
(Continued)

(56) References Cited

U.S. PATENT DOCUMENTS

| 11,424,592 B2* | 8/2022 | Lochman | H01S 5/02235 |
| 2003/0007539 A1* | 1/2003 | Sell | H01S 5/141 |
| | | | 372/92 |

(Continued)

FOREIGN PATENT DOCUMENTS

| JP | S56-168818 A | 12/1981 |
| JP | 11-026854 A | 1/1999 |
| JP | 2001-358384 A | 12/2001 |
| JP | 2003-258337 A | 9/2003 |
| JP | 2007-088066 A | 4/2007 |

OTHER PUBLICATIONS

International Search Report and Written Opinion for International Application No. PCT/US2020/055698, dated Feb. 3, 2021, 12 pages.

*Primary Examiner* — Xinning(Tom) Niu
(74) *Attorney, Agent, or Firm* — Morgan, Lewis & Bockius LLP

(57) ABSTRACT

In various embodiments, the concentration and deposition of siloxane materials within components of laser systems, such as laser resonators, is reduced or minimized utilizing mitigation systems that may also supply gas having low siloxane levels into multiple different components in series or in parallel.

28 Claims, 9 Drawing Sheets

Related U.S. Application Data

(60) Provisional application No. 62/915,766, filed on Oct. 16, 2019.

(51) Int. Cl.
*H01S 5/0222* (2021.01)
*H01S 5/024* (2006.01)
*H01S 5/30* (2006.01)

(52) U.S. Cl.
CPC .......... *H01S 5/4012* (2013.01); *H01S 5/4025* (2013.01); *H01S 5/3013* (2013.01)

(58) Field of Classification Search
CPC .. H01S 5/3013; H01S 5/02251; H01S 3/0816; H01S 5/143; H01S 5/4068; H01S 5/4062; B23K 26/00; B23K 26/702
See application file for complete search history.

(56) References Cited

U.S. PATENT DOCUMENTS

| | | | |
|---|---|---|---|
| 2003/0214987 A1* | 11/2003 | Yamanaka | H01S 5/4012 372/36 |
| 2003/0227957 A1* | 12/2003 | Pang | B01D 53/8675 372/59 |
| 2007/0266632 A1* | 11/2007 | Tsangaris | C10J 3/34 48/190 |
| 2009/0146846 A1* | 6/2009 | Grossman | G08B 29/22 340/988 |
| 2010/0077796 A1* | 4/2010 | Gadre | F25J 3/0209 62/620 |
| 2010/0095682 A1* | 4/2010 | Evans-Beauchamp | F02C 7/055 60/734 |
| 2013/0340616 A1 | 12/2013 | Iyer | |
| 2018/0252929 A1* | 9/2018 | Tayebati | H01S 5/4062 |
| 2021/0119411 A1 | 4/2021 | Lochman et al. | |

* cited by examiner

SILOXANE MITIGATION FOR LASER SYSTEMS

RELATED APPLICATIONS

This application is a continuation of U.S. patent application Ser. No. 17/071,205, filed Oct. 15, 2020, which claims the benefit of and priority to U.S. Provisional Patent Application No. 62/915,766, filed Oct. 16, 2019, the entire disclosure of each of which is hereby incorporated herein by reference.

TECHNICAL FIELD

In various embodiments, the present invention relates to laser systems, specifically apparatus and techniques for mitigating the impact of siloxanes in such laser systems.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Optical systems for laser systems are typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). That is, BPP=NA×D/2, where D is the focusing spot (the waist) diameter and NA is the numerical aperture; thus, the BPP may be varied by varying NA and/or D. The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, which is a wavelength-independent measure of beam quality.

Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

Siloxanes are a class of organosilicon materials featuring the functional group $[Si-O]_n$ and therefore possessing Si—O—Si bonds. These compounds may be linear or cyclic, and examples of siloxanes include hexamethyldisiloxane, octamethyltrisiloxane, hexamethylcyclotrisiloxane, and octamethylcyclotetrasiloxane. Siloxanes have many commercial and industrial applications, including laser systems, because of their hydrophobicity, low thermal conductivity, and high flexibility. Unfortunately, the power degradation of many laser emitters, for example GaN- and InGaN-based diode lasers emitting beams at visible (or shorter) wavelengths, can accelerate due to exposure to siloxanes, which may enter laser systems from the ambient atmosphere (from, e.g., outgassing from materials containing silicones, which are common in cosmetics, cleaning products, and pharmaceutical products) or evolve within laser systems due to outgassing of components therewithin (e.g., components including, consisting essentially of, or consisting of one or more silicones, e.g., gaskets, seals, epoxies, adhesives, etc.). Siloxanes within the laser system may be "captured" by the nitride-based laser emitter and attach to the laser emitter facet, resulting in power degradation. Such degradation may even be accelerated as the power and emitted light intensity of the laser emitter increases, as desired for present and future laser systems.

One technique to at least partially address this issue is the fabrication and installation of laser devices within a low-siloxane environment; however, the systems must then be hermetically sealed to prevent entry of siloxanes from the outside environment during operation, which can be challenging. In addition, such solutions do not adequately address siloxanes produced by outgassing. Thus, there is a need for systems and techniques for reducing or minimizing the exposure of laser-system components to siloxanes, thereby mitigating their deleterious effects.

SUMMARY

In accordance with embodiments of the present invention, siloxane-mitigation systems and techniques are utilized to reduce or minimize the exposure of the components internal to laser devices, including beam emitters, to siloxanes, and thereby reduce or minimize siloxane-induced degradation of performance and reliability. In various embodiments, one or more beam emitters are disposed within a "laser cavity" of a partially or fully sealed environment, also referred to herein as an "emitter module," a "resonator module," or a "resonator." The "laser cavity" refers to the portion of the resonator in which the beam emitters are disposed, and the laser cavity may be sealed from or open to one or more additional internal portions of the resonator, which typically contains other components such as optical elements, electrical connections, cooling systems and/or reservoirs, etc. In various embodiments, the laser cavity is connected to a closed-loop or open-loop circulation system that replaces and/or recirculates the gas internal to the laser cavity in order to remove siloxanes from the laser-cavity internal environment. In some embodiments, the circulation system forms a closed loop, in which the gas is pumped from the laser cavity to a siloxane-mitigation system, from which it is pumped back into the laser cavity. In other environments, the circulation system forms an open loop, in which gas (e.g., air) is pumped into the siloxane-mitigation system and thence to the laser cavity, where it is allowed to escape to the surrounding ambient (i.e., without being pumped back to the siloxane-mitigation system). The positive pressure created in such arrangements helps to prevent ingress of siloxanes into the laser cavity.

In various embodiments, the circulation system is operated continuously, thereby continuously exchanging the gas within the laser cavity with gas having a lower concentration of (or even being substantially free of) siloxanes therewithin. In other embodiments, the circulation system is operated at intervals, which may be irregularly or regularly scheduled, or the circulation system is operated on demand (e.g., when initiated by a human operator). For example, the laser cavity may include one or more monitors or sensors for sensing siloxane concentration, and the circulation system may operate to pump new gas into the laser cavity when the siloxane concentration reaches a threshold level.

In other embodiments, the circulation system may be operated during laser emission, in order to suppress generation and deposition of activated, higher-energy siloxane species. Particularly in laser systems incorporating laser emitters emitting at short wavelengths (e.g., visible light such as blue light, or even ultraviolet light), the high-energy laser light may activate siloxane molecules in the laser system illuminated by the light; that is, illumination by the light may radicalize or break the molecular structure of the siloxane species, rendering it more reactive (i.e., at a higher-energy state). Such activated species may react with other siloxane species in the laser system and be deposited at the laser emitter (e.g., at the emission facet). If the laser emitter has an oxide coating (e.g., a protective and/or anti-reflective overlayer), such deleterious deposition may be accelerated, given the large binding energy between silicon and oxygen. Thus, in various embodiments, the circulation system may be initiated prior to operation (i.e., laser emission) and turned off after laser emission and/or during periods during which laser energy is not being actively emitted by the system. In various embodiments, the circulation system may be initiated a short time (e.g., up to 1 minute, up to 2 minutes, up to 5 minutes, or up to 10 minutes) before operation, to reduce or minimize siloxane concentration within the system prior to operation. Similarly, the circulation system may continue to operate for a short time (e.g., up to 1 minute, up to 2 minutes, up to 5 minutes, or up to 10 minutes) after operation, in order to reduce or minimize the presence of siloxanes produced during operation.

In various embodiments, the circulation system operates on multiple different laser cavities or resonators in series or in parallel. Similarly, in various embodiments the circulation system may operate not only on laser cavities housing beam emitters, but also other portions or components (which may also be sealed) of the laser system, such as fiber optic modules. Therefore, descriptions herein involving "laser cavities" may be understood to equally apply to other components, systems, or sub-systems of a laser device or apparatus. In various embodiments, the circulation/siloxane-mitigation system may be utilized with one or more enclosed components such as laser resonators. As used herein, and "enclosed" component has one or more sealed areas, e.g., a laser cavity containing one or more beam emitters therewithin; that is, an enclosed component need not be, but may be, sealed in its entirety.

In various embodiments, the siloxane-mitigation system may include, consist essentially of, or consist of a material for adsorption of the siloxane from the gas stream, such as activated carbon, silica gel, polymer beads, or one or more molecular sieves. In various embodiments, the siloxane-mitigation system may include, consist essentially of, or consist of a material for absorption of the siloxane from the gas stream, such as organic solvents, mineral oil, or even water. In the siloxane-mitigation system, the gas to be pumped into the laser cavity may flow over and/or through (e.g., bubbled through) one or more such materials for adsorption and/or absorption of siloxanes from the gas. Thus, in various embodiments, removing siloxanes from the gas may introduce moisture (e.g., a quantity of one or more liquids) into the gas. In some embodiments, the siloxane-mitigation system may alternatively, or in addition, include, consist essentially of, or consist of a remediation system that removes siloxane from the gas stream via condensation (e.g., one or more cooling systems) and/or reaction (such as catalysis). In various embodiments, the siloxane-mitigation system may also include a drying system (e.g., a container having therewithin one or more desiccants) to remove moisture from the gas prior to introduction of the gas into the laser cavity.

In accordance with embodiments of the invention, laser resonators interfacing with a siloxane-mitigation system may include one or more laser emitters emitting light in the visible-wavelength regime (or shorter wavelengths such as ultraviolet wavelengths), and/or may be composed, at least in part, by nitride-based semiconductor materials such as GaN and InGaN. While systems utilizing longer-wavelength emitters may not exhibit power degradation due to siloxane exposure to the same extent, embodiments of the invention may also be utilized with such emitters for long-term stability and reliability.

Resonators in accordance with embodiments of the invention may include one or more components, interfaces, and/or control systems detailed in U.S. patent application Ser. No. 15/660,134, filed on Jul. 26, 2017 (the '134 application), and/or U.S. patent application Ser. No. 16/421,728, filed on May 24, 2019, the entire disclosure of each of which is incorporated by reference herein. For example, resonator modules in accordance with embodiments of the invention may include electrical and optical interfaces that interface with complementary features on a beam-combining enclosure in which the individual beams from the modules are combined into a single output beam (and, in some embodiments, coupled into an optical fiber). The optical and electrical interfaces facilitate the easy replacement of input laser sources with a minimal amount, if any, of source alignment. The emitter modules may be insertable into and mate with input receptacles disposed in or on the enclosure in which the input beams are combined to form the output beam. Resonator modules may connect mechanically, electrically, and/or optically with one of multiple input receptacles disposed in or on (or forming portions of) the enclosure for the beam-combining optics.

As known to those of skill in the art, lasers are generally defined as devices that generate visible or invisible light through stimulated emission of light. Lasers generally have properties that make them useful in a variety of applications, as mentioned above. Common laser types include semiconductor lasers (e.g., laser diodes and diode bars), solid-state lasers, fiber lasers, and gas lasers. A laser diode is generally based on a simple diode structure that supports the emission of photons (light). However, to improve efficiency, power, beam quality, brightness, tunability, and the like, this simple structure is generally modified to provide a variety of many practical types of laser diodes. Laser diode types include small edge-emitting varieties that generate from a few milliwatts up to roughly half a watt of output power in a beam with high beam quality. Structural types of diode lasers include double hetero-structure lasers that feature a layer of low bandgap material sandwiched between two high bandgap layers; quantum well lasers that include a very thin middle (quantum well) layer resulting in high efficiency and quantization of the laser's energy; multiple quantum well lasers that include more than one quantum well layer to improve gain characteristics; quantum wire or quantum sea (dots) lasers that replace the middle layer with a wire or dots to produce higher-efficiency quantum well lasers; quantum cascade lasers that enable laser action at relatively long wavelengths that may be tuned by altering the thickness of the quantum layer; separate confinement heterostructure lasers, which are the most common commercial laser diode and include another two layers above and below the quantum well layer to efficiently confine the light produced; distributed feedback lasers, which are commonly used in demanding optical communication applications and include an integrated diffraction grating that facilitates generating a stable wavelength set during manufacturing by reflecting a single wavelength back to the gain region; vertical-cavity surface-emitting lasers (VCSELs), which have a different structure that other laser diodes in that light is emitted from its surface rather than from its edge; and vertical-external-cavity surface-emitting lasers (VECSELs) and external-cavity diode lasers, which are tunable lasers that use mainly double heterostructure diodes and include gratings or multiple-prism grating configurations. External-cavity diode lasers are often wavelength-tunable and exhibit a small emission line width. Laser diode types also include a variety of high power diode-based lasers including: broad area lasers that are characterized by multi-mode diodes with oblong output facets and generally have poor beam quality but generate a few watts of power; tapered lasers that are characterized by astigmatic mode diodes with tapered output facets that exhibit improved beam quality and brightness when compared to broad area lasers; ridge waveguide lasers that are characterized by elliptical mode diodes with oval output facets; and slab-coupled optical waveguide lasers (SCOWL) that are characterized by circular mode diodes with output facets and may generate watt-level output in a diffraction-limited beam with nearly a circular profile.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 µm×100 µm. The beam quality along the 1 µm dimension or fast-axis is typically diffraction-limited. The beam quality along the 100 µm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

Embodiments of the present invention may couple one or more laser beams into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation, unless otherwise indicated. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs). Herein, it is understood that references to different "wavelengths" encompass different "ranges of wavelengths," and the wavelength (or color) of a laser corresponds to the primary wavelength thereof; that is, emitters may emit light having a finite band of wavelengths that includes (and may be centered on) the primary wavelength.

Laser systems having siloxane-mitigation systems and utilizing siloxane-mitigation techniques in accordance with embodiments of the present invention may be utilized to process a workpiece such that the surface of the workpiece is physically altered and/or such that a feature is formed on or within the surface, in contrast with optical techniques that merely probe a surface with light (e.g., reflectivity measurements). Exemplary processes in accordance with embodiments of the invention include cutting, welding, drilling, and soldering. Various embodiments of the invention also process workpieces at one or more spots or along a one-dimensional processing path, rather than simultaneously flooding all or substantially all of the workpiece surface with radiation from the laser beam. In general, processing paths may be curvilinear or linear, and "linear" processing paths may feature one or more directional changes, i.e., linear processing paths may be composed of two or more substantially straight segments that are not necessarily parallel to each other.

Various embodiments of the invention may be utilized with laser systems featuring techniques for varying BPP of their output laser beams, such as those described in U.S. patent application Ser. No. 14/632,283, filed on Feb. 26, 2015, and U.S. patent application Ser. No. 15/188,076, filed on Jun. 21, 2016, the entire disclosure of each of which is incorporated herein by reference.

Laser systems in accordance with various embodiments of the present invention may also include a delivery mechanism that directs the laser output onto the workpiece while causing relative movement between the output and the workpiece. For example, the delivery mechanism may include, consist essentially of, or consist of a laser head for directing and/or focusing the output toward the workpiece. The laser head may itself be movable and/or rotatable relative to the workpiece, and/or the delivery mechanism may include a movable gantry or other platform for the workpiece to enable movement of the workpiece relative to the output, which may be fixed in place.

In various embodiments of the present invention, the laser beams utilized for processing of various workpieces may be delivered to the workpiece via one or more optical fibers (or "delivery fibers"). Embodiments of the invention may incorporate optical fibers having many different internal configurations and geometries. Such optical fibers may have one or more core regions and one or more cladding regions. For example, the optical fiber may include, consist essentially of, or consist of a central core region and an annular core region separated by an inner cladding layer. One or more outer cladding layers may be disposed around the annular core region. Embodiments of the invention may be utilized with and/or incorporate optical fibers having configurations described in U.S. patent application Ser. No. 15/479,745, filed on Apr. 5, 2017, and U.S. patent application Ser. No. 16/675,655, filed on Nov. 6, 2019, the entire disclosure of each of which is incorporated by reference herein.

Structurally, optical fibers in accordance with embodiments of the invention may include one or more layers of high and/or low refractive index beyond (i.e., outside of) an exterior cladding without altering the principles of the present invention. Various ones of these additional layers may also be termed claddings or coatings, and may not guide light. Optical fibers may also include one or more cores in addition to those specifically mentioned. Such variants are within the scope of the present invention. Various embodiments of the invention do not incorporate mode strippers in or on the optical fiber structure. Similarly, the various layers of optical fibers in accordance with embodiments of the invention are continuous along the entire length of the fiber and do not contain holes, photonic-crystal structures, breaks, gaps, or other discontinuities therein.

Optical fibers in accordance with the invention may be multi-mode fibers and therefore support multiple modes therein (e.g., more than three, more than ten, more than 20, more than 50, or more than 100 modes). In addition, optical fibers in accordance with the invention are generally passive fibers, i.e., are not doped with active dopants (e.g., erbium, ytterbium, thulium, neodymium, dysprosium, praseodymium, holmium, or other rare-earth metals) as are typically utilized for pumped fiber lasers and amplifiers. Rather, dopants utilized to select desired refractive indices in various layers of fibers in accordance with the present invention are generally passive dopants that are not excited by laser light, e.g., fluorine, titanium, germanium, and/or boron. Thus, optical fibers, and the various core and cladding layers thereof in accordance with various embodiments of the invention may include, consist essentially of, or consist of glass, such as substantially pure fused silica and/or fused silica, and may be doped with fluorine, titanium, germanium, and/or boron. Obtaining a desired refractive index for a particular layer or region of an optical fiber in accordance with embodiments of the invention may be accomplished (by techniques such as doping) by one of skill in the art without undue experimentation. Relatedly, optical fibers in accordance with embodiments of the invention may not incorporate reflectors or partial reflectors (e.g., grating such as Bragg gratings) therein or thereon. Fibers in accordance with embodiments of the invention are typically not pumped with pump light configured to generate laser light of a different wavelength. Rather, fibers in accordance with embodiments of the invention merely propagate light along their lengths without changing its wavelength. Optical fibers utilized in various embodiments of the invention may feature an optional external polymeric protective coating or sheath disposed around the more fragile glass or fused silica fiber itself.

In addition, systems and techniques in accordance with embodiments of the present invention are typically utilized for materials processing (e.g., cutting, drilling, etc.), rather than for applications such as optical communication or optical data transmission. Thus, laser beams, which may be coupled into fibers in accordance with embodiments of the invention, may have wavelengths different from the 1.3 µm or 1.5 µm utilized for optical communication. In fact, fibers utilized in accordance with embodiments of the present invention may exhibit dispersion at one or more (or even all) wavelengths in the range of approximately 1260 nm to approximately 1675 nm utilized for optical communication.

In an aspect, embodiments of the invention feature a laser apparatus including, consisting essentially of, or consisting of an enclosed laser cavity comprising one or more beam emitters therewithin, a gas inlet for permitting ingress of gas into the laser cavity, a pump for supplying gas to the gas inlet, and a siloxane-mitigation system configured to remove siloxanes from gas supplied to the gas inlet by the pump.

Embodiments of the invention may include one or more of the following in any of a variety of combinations. At least one beam emitter may include, consist essentially of, or consist of one or more nitride semiconductor materials. At least one beam emitter may include, consist essentially of, or consist of GaN, AlGaN, InGaN, AlN, InN, and/or an alloy or mixture thereof. The laser cavity may be configured to allow leakage of the supplied gas therefrom i.e., may not have a single dedicated gas outlet). The apparatus may include a gas outlet for permitting or configured to permit egress of gas from the laser cavity. The pump may be fluidly connected to the gas outlet. The gas outlet may be configured to release gas into a surrounding ambient and/or into an exhaust system. The apparatus may include a desiccant positioned to remove moisture from gas supplied to the gas inlet by the pump. The desiccant may be different from, and/or positioned outside of, the siloxane-mitigation system. The siloxane-mitigation system may include, consist essentially of, or consist of a siloxane-adsorbing material and/or a siloxane-absorbing material. The siloxane-mitigation system may include, consist essentially of, or consist of activated carbon, silica gel, polymer beads, and/or one or more molecular sieves. The siloxane-mitigation system may include, consist essentially of, or consist of an organic solvent, mineral oil, or water. The siloxane-mitigation system may include, consist essentially of, or consist of a remediation system configured to remove siloxanes from the gas via condensation and/or reaction. The siloxane-mitigation system may include, consist essentially of, or consist of a liquid over and/or through which gas supplied to the gas inlet is flowed.

The apparatus may include one or more sensors configured to detect siloxanes within the laser cavity and/or within one or more conduits fluidly connected to the gas inlet, the pump, and/or the siloxane-mitigation system. The apparatus may include a computer-based controller configured to introduce gas into the gas inlet via operation of the pump and/or to control the siloxane-mitigation system. The apparatus may include one or more sensors configured to detect siloxanes within the laser cavity and/or within one or more conduits fluidly connected to the gas inlet, the pump, and/or the siloxane-mitigation system, and the controller may be responsive to signals received from the one or more sensors. The controller may be configured to introduce gas into the gas inlet only when a siloxane concentration detected by at least one of the sensors exceeds a threshold. The controller may be configured to introduce gas into the gas inlet continuously, at least during operation of the one or more beam emitters. The controller may be configured to introduce gas into the gas inlet at regular intervals, e.g., whether or more the one or more beam emitters are operating to emit beams. The controller may be configured to introduce gas into the gas inlet upon receipt of a command from an operator. The laser cavity may be hermetically sealed. The laser cavity may include therewithin one or more materials that produce siloxanes via outgassing.

The one or more beam emitters may include, consist essentially of, or consist of a plurality of beam emitters. The laser cavity may include therewithin (A) a dispersive element configured to receive beams emitted by the plurality of emitters and combine the beams into a multi-wavelength beam, and disposed optically downstream of the dispersive element, a partially reflective output coupler configured to (i) receive the multi-wavelength beam, (ii) transmit a first portion of the multi-wavelength beam as an output beam, and (iii) reflect a second portion of the multi-wavelength beam back toward the dispersive element. The laser cavity may include therewithin (A) a plurality of slow-axis collimation lenses disposed optically downstream of the plurality of beam emitters, each slow-axis collimation lens configured to receive one or more beams from one of the beam emitters, and (B) a plurality of folding mirrors disposed optically downstream of the slow-axis collimation lenses and optically upstream of the dispersive element. The apparatus may include a fluid coolant cavity disposed beneath the plurality of beam emitters, a fluid inlet configured to supply fluid coolant to the fluid coolant cavity, and a fluid outlet configured to exhaust fluid coolant from the fluid coolant cavity.

In another aspect, embodiments of the invention include a laser apparatus including, consisting essentially of, or consisting of a laser system including, consisting essentially of, or consisting of a plurality of enclosed components, a plurality of gas inlets, a plurality of gas outlets, an inlet manifold fluidly coupled to the plurality of gas inlets, a pump for supplying gas to the inlet manifold, and a siloxane-mitigation system configured to remove siloxanes from gas supplied to the inlet manifold by the pump. At least one of the components includes one or more beam emitters therewithin. Each gas inlet is configured to permit ingress of gas into a different component. Each gas outlet is configured to permit egress of gas from a different component.

Embodiments of the invention may include one or more of the following in any of a variety of combinations. One or more of the components may not include a beam emitter therewithin. At least one beam emitter may include, consist essentially of, or consist of one or more nitride semiconductor materials. At least one beam emitter may include, consist essentially of, or consist of GaN, AlGaN, InGaN, AlN, InN, and/or an alloy or mixture thereof. The apparatus may include an outlet manifold fluidly coupled to the plurality of gas outlets. The pump may be fluidly connected to the outlet manifold. The outlet manifold may be configured to release gas into a surrounding ambient and/or into an exhaust system. The plurality of gas outlets may be configured to release gas into a surrounding ambient and/or into an exhaust system. The apparatus may include a desiccant positioned to remove moisture from gas supplied to the inlet manifold by the pump. The desiccant may be different from, and/or positioned outside of, the siloxane-mitigation system. The siloxane-mitigation system may include, consist essentially of, or consist of a siloxane-adsorbing material and/or a siloxane-absorbing material. The siloxane-mitigation system may include, consist essentially of, or consist of activated carbon, silica gel, polymer beads, and/or one or more molecular sieves. The siloxane-mitigation system may include, consist essentially of, or consist of an organic solvent, mineral oil, or water. The siloxane-mitigation system may include, consist essentially of, or consist of a remediation system configured to remove siloxanes from the gas via condensation and/or reaction. The siloxane-mitigation system may include, consist essentially of, or consist of a liquid over and/or through which gas supplied to the inlet manifold is flowed.

The apparatus may include one or more sensors configured to detect siloxanes within at least one component and/or within one or more conduits fluidly connected to the pump, at least one component, the inlet manifold, and/or the siloxane-mitigation system. The apparatus may include a computer-based controller configured to introduce gas into the inlet manifold via operation of the pump and/or to control the siloxane-mitigation system. The apparatus may include one or more sensors configured to detect siloxanes within at least one component and/or within one or more conduits fluidly connected to the pump, at least one component, the inlet manifold, and/or the siloxane-mitigation system, and the controller may be responsive to signals received from the one or more sensors. The controller may be configured to introduce gas into the inlet manifold only when a siloxane concentration detected by at least one of the sensors exceeds a threshold. The controller may be configured to introduce gas into the inlet manifold continuously, at least during operation of the one or more beam emitters. The controller may be configured to introduce gas into the inlet manifold at regular intervals, e.g., whether or more the one or more beam emitters are operating to emit beams. The controller may be configured to introduce gas into the inlet manifold upon receipt of a command from an operator. At least one component may be hermetically sealed. At least one component may include therewithin one or more materials that produce siloxanes via outgassing.

At least one of the components may be, include, consist essentially of, or consist of a laser resonator having an enclosed laser cavity. The laser cavity may include therewithin (A) a plurality of beam emitters, (B) a dispersive element configured to receive beams emitted by the plurality of emitters and combine the beams into a multi-wavelength beam, and (C) disposed optically downstream of the dispersive element, a partially reflective output coupler configured to (i) receive the multi-wavelength beam, (ii) transmit a first portion of the multi-wavelength beam as an output beam, and (iii) reflect a second portion of the multi-wavelength beam back toward the dispersive element. The laser cavity may include therewithin (A) a plurality of slow-axis collimation lenses disposed optically downstream of the plurality of beam emitters, each slow-axis collimation lens configured to receive one or more beams from one of the beam emitters, and (B) a plurality of folding mirrors disposed optically downstream of the slow-axis collimation lenses and optically upstream of the dispersive element. The laser resonator may include a fluid coolant cavity disposed beneath the plurality of beam emitters, a fluid inlet configured to supply fluid coolant to the fluid coolant cavity, and a fluid outlet configured to exhaust fluid coolant from the fluid coolant cavity.

The plurality of components may include, consist essentially of, or consist of a plurality of laser resonators. Each laser resonator may include a plurality of beam emitters therewithin and be configured to combine beams emitted by the beam emitters into a combined beam. The plurality of components may include (A) a beam-combining module configured to receive the combined beams from the laser resonators and combine the combined beams into an output beam, and (B) a fiber optic module configured to receive the output beam from the beam-combining module and supply the output beam to an optical fiber.

In yet another aspect, embodiments of the invention feature a laser apparatus including, consisting essentially of, or consisting of a laser system including, consisting essentially of, or consisting of a plurality of enclosed components, a pump for supplying gas to the gas inlet of a first one of the components, and a siloxane-mitigation system configured to remove siloxanes from gas supplied by the pump. At least one of the components includes one or more beam emitters therewithin. Each component includes a gas inlet configured to permit ingress of gas into the component and a gas outlet configured to permit egress of gas out of the component. The components are fluidly connected to each other in series (e.g., via their gas inlets and gas outlets and conduits connecting them). The gas supplied by the pump supplied flows sequentially into and out of each of the series-connected components.

Embodiments of the invention may include one or more of the following in any of a variety of combinations. The apparatus may include an inlet manifold fluidly coupled to the gas inlet of the first one of the components. The pump may supply gas to the inlet manifold for supply to the gas inlet of the first one of the components. One or more of the components may not include a beam emitter therewithin. At least one beam emitter may include, consist essentially of, or consist of one or more nitride semiconductor materials. At least one beam emitter may include, consist essentially of, or consist of GaN, AlGaN, InGaN, AlN, InN, and/or an alloy or mixture thereof. The apparatus may include an outlet manifold fluidly coupled to a gas outlet of a last one of the components (e.g., the last one in the series connection of the components). The pump may be fluidly connected to the outlet manifold. The outlet manifold may be configured to release gas into a surrounding ambient and/or into an exhaust system. The gas outlet of a last one of the components may be fluidly connected to the pump. The gas outlet of a last one of the components may be configured to release gas into a surrounding ambient and/or into an exhaust system. The apparatus may include a desiccant positioned to remove moisture from gas supplied by the pump. The desiccant may be different from, and/or positioned outside of, the siloxane-mitigation system. The siloxane-mitigation system may include, consist essentially of, or consist of a siloxane-adsorbing material and/or a siloxane-absorbing material. The siloxane-mitigation system may include, consist essentially of, or consist of activated carbon, silica gel, polymer beads, and/or one or more molecular sieves. The siloxane-mitigation system may include, consist essentially of, or consist of an organic solvent, mineral oil, or water. The siloxane-mitigation system may include, consist essentially of, or consist of a remediation system configured to remove siloxanes from the gas via condensation and/or reaction. The siloxane-mitigation system may include, consist essentially of, or consist of a liquid over and/or through which gas supplied by the pump is flowed.

The apparatus may include one or more sensors configured to detect siloxanes within at least one component and/or within one or more conduits fluidly connected to the pump, at least one component, and/or the siloxane-mitigation system. The apparatus may include a computer-based controller configured to operate the pump and/or to control the siloxane-mitigation system. The apparatus may include one or more sensors configured to detect siloxanes within at least one component and/or within one or more conduits fluidly connected to the pump, at least one component, and/or the siloxane-mitigation system, and the controller may be responsive to signals received from the one or more sensors. The controller may be configured to operate the pump only when a siloxane concentration detected by at least one of the sensors exceeds a threshold. The controller may be configured to operate the pump continuously, at least during operation of the one or more beam emitters. The controller may be configured to operate the pump at regular intervals, e.g., whether or more the one or more beam emitters are operating to emit beams. The controller may be configured to operate the pump upon receipt of a command from an operator. At least one component may be hermetically sealed. At least one component may include therewithin one or more materials that produce siloxanes via outgassing.

At least one of the components may be, include, consist essentially of, or consist of a laser resonator having an enclosed laser cavity. The laser cavity may include therewithin (A) a plurality of beam emitters, (B) a dispersive element configured to receive beams emitted by the plurality of emitters and combine the beams into a multi-wavelength beam, and (C) disposed optically downstream of the dispersive element, a partially reflective output coupler configured to (i) receive the multi-wavelength beam, (ii) transmit a first portion of the multi-wavelength beam as an output beam, and (iii) reflect a second portion of the multi-wavelength beam back toward the dispersive element. The laser cavity may include therewithin (A) a plurality of slow-axis collimation lenses disposed optically downstream of the plurality of beam emitters, each slow-axis collimation lens configured to receive one or more beams from one of the beam emitters, and (B) a plurality of folding mirrors disposed optically downstream of the slow-axis collimation lenses and optically upstream of the dispersive element. The laser resonator may include a fluid coolant cavity disposed beneath the plurality of beam emitters, a fluid inlet configured to supply fluid coolant to the fluid coolant cavity, and a fluid outlet configured to exhaust fluid coolant from the fluid coolant cavity.

The plurality of components may include, consist essentially of, or consist of a plurality of laser resonators. Each laser resonator may include a plurality of beam emitters therewithin and be configured to combine beams emitted by the beam emitters into a combined beam. The plurality of components may include (A) a beam-combining module configured to receive the combined beams from the laser resonators and combine the combined beams into an output beam, and (B) a fiber optic module configured to receive the output beam from the beam-combining module and supply the output beam to an optical fiber.

In another aspect, embodiments of the invention feature a method of emission (e.g., reliable emission) of one or more beams by a laser apparatus. One or more beam emitters disposed within an enclosed laser cavity are operated to form one or more beams. Thereduring, gas within the laser cavity is exchanged with new gas having a lower concentration of siloxanes therewithin.

Embodiments of the invention may include one or more of the following in any of a variety of combinations. Exchanging gas within the laser cavity may include, consist essentially of, or consist of removing siloxanes from the new gas and thereafter supplying the new gas to the laser cavity. Siloxanes may be removed from the new gas via adsorption and/or absorption. Siloxanes may be adsorbed by activated carbon, silica gel, polymer beads, and/or one or more molecular sieves. Siloxanes may be absorbed by an organic solvent, mineral oil, and/or water. Siloxanes may be removed from the new gas via condensation and/or reaction. Siloxanes may be removed from the new gas by flowing the new gas over and/or through a liquid. The laser cavity may be configured to allow leakage of gas therefrom. Exchanging gas within the laser cavity may include, consist essentially of, or consist of supplying new gas to a gas inlet fluidly coupled to the laser cavity and exhausting gas via a gas outlet fluidly coupled to the laser cavity. The gas outlet may be configured to release gas into a surrounding ambient and/or into an exhaust system. Moisture may be removed from the new gas prior to introduction thereof into the laser cavity. Moisture may be removed from the new gas after, and/or separately, from siloxane removal from the new gas.

A concentration of siloxanes within the laser cavity, within new gas supplied to the laser cavity, and/or gas exhausted from the laser cavity may be detected. Gas may be exchanged within the laser cavity only when a detected siloxane concentration exceeds a threshold. Gas may be exchanged within the laser cavity continuously during operation of the one or more beam emitters. Gas may be exchanged within the laser cavity at regular intervals, e.g., only when the beam emitters are operating or whether or not the beam emitters are operating. Gas may be exchanged within the laser cavity upon receipt of a command from an operator (e.g., a human operator). The laser cavity may be hermetically sealed. The laser cavity may include therewithin one or more materials that produce siloxanes via outgassing. At least one beam emitter may include, consist essentially of, or consist of one or more nitride semiconductor materials. At least one beam emitter may include, consist essentially of, or consist of GaN, AlGaN, InGaN, AlN, InN, and/or an alloy or mixture thereof.

The one or more beam emitters may include, consist essentially of, or consist of a plurality of beam emitters. Beams emitted by the beam emitters may each have a different wavelength. Beams emitted by the plurality of beam emitters may be combined into a combined and/or multi-wavelength beam. A first portion of the combined and/or multi-wavelength beam may be transmitted out of the laser cavity as an output beam. A second portion of the combined and/or multi-wavelength beam may be directed back to the plurality of beam emitters to stabilize emission thereof (e.g., to form external lasing cavities). The plurality of beam emitters may be cooled, e.g., via flow of a fluid coolant. A workpiece may be processed with the output beam. Processing the workpiece may include, consist essentially of, or consist of cutting, welding, etching, annealing, drilling, soldering, and/or brazing. Processing the workpiece may include, consist essentially of, or consist of physically altering at least a portion of a surface of the workpiece.

In yet another aspect, embodiments of the invention feature a method of emission (e.g., reliable emission) of one or more beams by a laser apparatus. The laser apparatus includes, consists essentially of, or consists of a plurality of enclosed components. At least one of the components includes one or more beam emitters therewithin. Each of the components includes gas therewithin. One or more of the components may be sealed or enclosed. The one or more beam emitters are operated to form one or more beams. Thereduring, new gas is supplied to each of the components in parallel. The new gas has a lower concentration of siloxanes therewithin (e.g., compared to the concentration of siloxanes in the gas initially present in at least one of the components). The new gas flows into and out of each component in parallel and/or simultaneously (e.g., via one or more conduits dedicated to each component).

Embodiments of the invention may include one or more of the following in any of a variety of combinations. Siloxanes may be removed from the new gas before and/or during supplying the new gas to each of the components in parallel. Siloxanes may be removed from the new gas via adsorption and/or absorption. Siloxanes may be adsorbed by activated carbon, silica gel, polymer beads, and/or one or more molecular sieves. Siloxanes may be absorbed by an organic solvent, mineral oil, and/or water. Siloxanes may be removed from the new gas via condensation and/or reaction. Siloxanes may be removed from the new gas by flowing the new gas over and/or through a liquid. At least one component may be configured to allow leakage of gas therefrom. The new gas may be supplied to each component via a gas inlet thereof (e.g., a gas inlet coupled only to the particular component). Gas may be exhausted from each component via a gas outlet thereof (e.g., via a gas outlet coupled only to the particular component). At least one gas outlet may be configured to release gas into a surrounding ambient and/or into an exhaust system. Moisture may be removed from the new gas prior to supplying the new gas to each of the components in parallel. Moisture may be removed from the new gas after, and/or separately, from siloxane removal from the new gas.

A concentration of siloxanes within at least one component, within new gas supplied to at least one component, and/or gas exhausted from at least one component may be detected. New gas may be supplied to each of the components in parallel only when a detected siloxane concentration exceeds a threshold. New gas may be supplied to each of the components in parallel continuously during operation of the one or more beam emitters. New gas may be supplied to each of the components in parallel at regular intervals, e.g., only when the beam emitters are operating or whether or not the beam emitters are operating. New gas may be supplied to each of the components in parallel upon receipt of a command from an operator (e.g., a human operator). At least one component may be hermetically sealed. At least one component may include therewithin one or more materials that produce siloxanes via outgassing. At least one beam emitter may include, consist essentially of, or consist of one or more nitride semiconductor materials. At least one beam emitter may include, consist essentially of, or consist of GaN, AlGaN, InGaN, AlN, InN, and/or an alloy or mixture thereof.

At least one of the components may include, consist essentially of, or consist of a laser resonator having a plurality of beam emitters therewithin. Beams emitted by the plurality of beam emitters may be combined into a combined and/or multi-wavelength beam. A first portion of the combined and/or multi-wavelength beam may be transmitted out of the laser cavity as an output beam. A second portion of the combined and/or multi-wavelength beam may be directed back to the plurality of beam emitters to stabilize emission thereof (e.g., to form external lasing cavities). The plurality of beam emitters may be cooled, e.g., via flow of a fluid coolant.

The plurality of components may include, consist essentially of, or consist of (i) two or more laser resonators each including one or more beam emitters therein, (ii) a beam-combining module, and (iii) a fiber optic module. An output beam may be emitted from each of the two or more laser resonators. Each output beam may be a multi-wavelength beam. Each output beam may itself be a beam formed via combination of multiple beams within the associated laser resonator. The output beams from the two or more laser resonators may be combined into a combined beam within the beam-combining module. The combined beam may be coupled into an optical fiber via, by, or within the fiber optic module. A workpiece may be processed with the combined beam. Processing the workpiece may include, consist essentially of, or consist of cutting, welding, etching, annealing, drilling, soldering, and/or brazing. Processing the workpiece may include, consist essentially of, or consist of physically altering at least a portion of a surface of the workpiece.

In another aspect, embodiments of the invention feature a method of emission (e.g., reliable emission) of one or more beams by a laser apparatus. The laser apparatus includes, consists essentially of, or consists of a plurality of enclosed components fluidly connected to each other in series (e.g., via a series of conduits each fluidly coupling two of the components together). At least one of the components includes one or more beam emitters therewithin. Each of the components includes gas therewithin. One or more of the components may be sealed or enclosed. The one or more beam emitters are operated to form one or more beams. Thereduring, new gas is supplied to a first one of the series-connected components. The new gas has a lower concentration of siloxanes therewithin (e.g., compared to the concentration of siloxanes in the gas initially present in at least one of the components). The supplied new gas flows sequentially into and out of each of the series-connected components.

Embodiments of the invention may include one or more of the following in any of a variety of combinations. Siloxanes may be removed from the new gas before and/or during supplying the new gas to the first one of the series-connected components. Siloxanes may be removed from the new gas via adsorption and/or absorption. Siloxanes may be adsorbed by activated carbon, silica gel, polymer beads, and/or one or more molecular sieves. Siloxanes may be absorbed by an organic solvent, mineral oil, and/or water. Siloxanes may be removed from the new gas via condensation and/or reaction. Siloxanes may be removed from the new gas by flowing the new gas over and/or through a liquid. At least one component may be configured to allow leakage of gas therefrom. Gas (e.g., new gas) may be exhausted from a last one of the series-connected components. The exhausted gas may be recirculated (e.g., toward the first one of the series connected components, toward a pump, and/or toward a siloxane-mitigation system), and siloxanes may be removed therefrom for introduction back to the first one of the series-connected components. Gas (e.g., new gas) may be exhausted from the last one of the series-connected components into a surrounding ambient and/or into an exhaust system. Moisture may be removed from the new gas prior to supplying the new gas to the first one of the series-connected components. Moisture may be removed from the new gas after, and/or separately, from siloxane removal from the new gas.

A concentration of siloxanes within at least one component, within new gas supplied to the first one of the series-connected components, within gas (e.g., new gas) supplied to at least one component, and/or gas exhausted from at least one component may be detected. New gas may be supplied to the first one of the series-connected components only when a detected siloxane concentration exceeds a threshold. New gas may be supplied to the first one of the series-connected components continuously during operation of the one or more beam emitters. New gas may be supplied to the first one of the series-connected components at regular intervals, e.g., only when the beam emitters are operating or whether or not the beam emitters are operating. New gas may be supplied to the first one of the series-connected components upon receipt of a command from an operator (e.g., a human operator). At least one component may be hermetically sealed. At least one component may include therewithin one or more materials that produce siloxanes via outgassing. At least one beam emitter may include, consist essentially of, or consist of one or more nitride semiconductor materials. At least one beam emitter may include, consist essentially of, or consist of GaN, AlGaN, InGaN, AlN, InN, and/or an alloy or mixture thereof.

At least one of the components may include, consist essentially of, or consist of a laser resonator having a plurality of beam emitters therewithin. Beams emitted by the plurality of beam emitters may be combined into a combined and/or multi-wavelength beam. A first portion of the combined and/or multi-wavelength beam may be transmitted out of the laser cavity as an output beam. A second portion of the combined and/or multi-wavelength beam may be directed back to the plurality of beam emitters to stabilize emission thereof (e.g., to form external lasing cavities). The plurality of beam emitters may be cooled, e.g., via flow of a fluid coolant.

The plurality of components may include, consist essentially of, or consist of (i) two or more laser resonators each including one or more beam emitters therein, (ii) a beam-combining module, and (iii) a fiber optic module. An output beam may be emitted from each of the two or more laser resonators. Each output beam may be a multi-wavelength beam. Each output beam may itself be a beam formed via combination of multiple beams within the associated laser resonator. The output beams from the two or more laser resonators may be combined into a combined beam within the beam-combining module. The combined beam may be coupled into an optical fiber via, by, or within the fiber optic module. A workpiece may be processed with the combined beam. Processing the workpiece may include, consist essentially of, or consist of cutting, welding, etching, annealing, drilling, soldering, and/or brazing. Processing the workpiece may include, consist essentially of, or consist of physically altering at least a portion of a surface of the workpiece.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other. Distances utilized herein may be considered to be "optical distances" unless otherwise specified.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
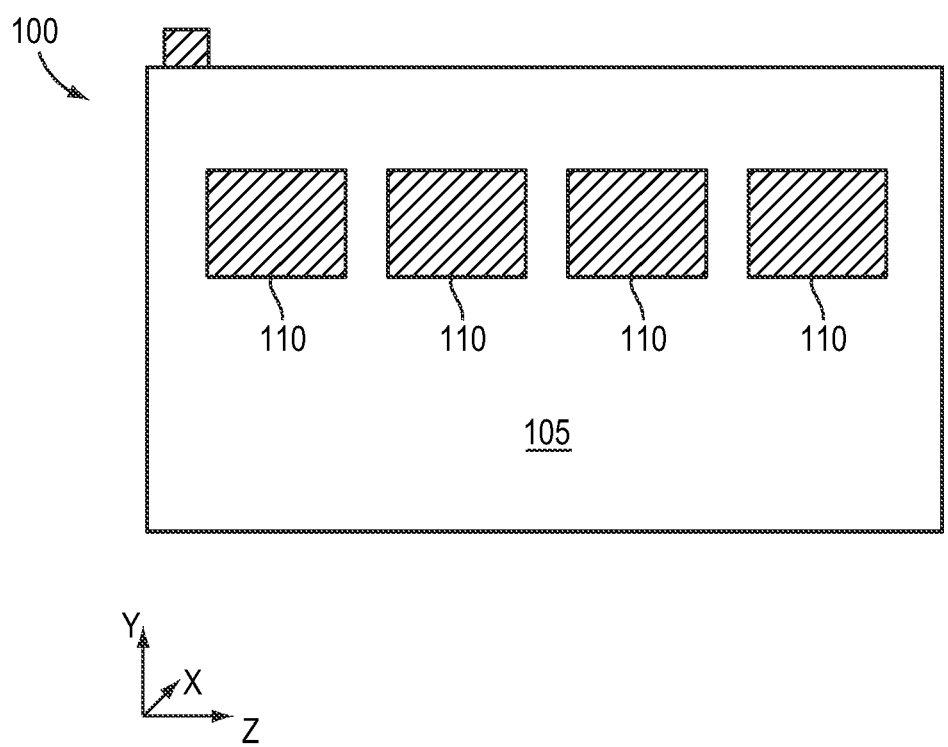
FIG. 1A is a schematic diagram of a laser resonator in accordance with embodiments of the present invention.
Figure 1B:
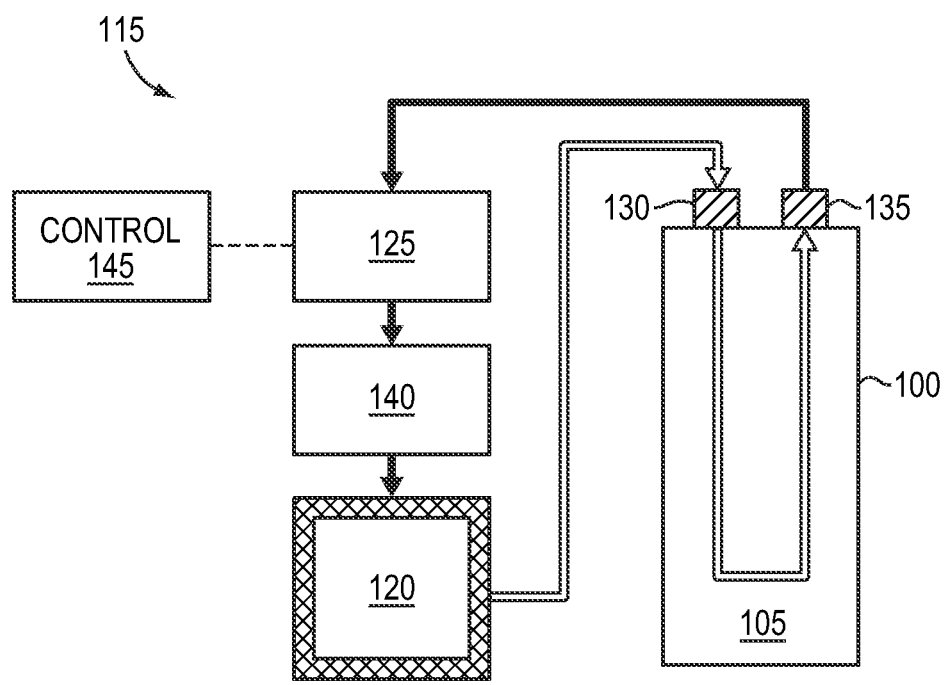
FIGS. 1B and 1C are schematic diagrams of laser systems in accordance with embodiments of the present invention.

FIG. 1A is a simplified schematic cross-sectional view of a resonator 100 that may be utilized with embodiments of the present invention. As shown, the resonator 100 features an enclosed laser cavity 105 that may constitute all or only a portion of the interior volume of the resonator 100. Disposed within the laser cavity 105 are one or more beam emitters 110. Beam emitters 110 in accordance with embodiments of the invention may be composed, at least partially, of one or more semiconductor materials (e.g., nitride semiconductor materials) such as GaN, InGaN, and/or AlGaN. Such beam emitters 110 may include laser diodes and/or diode bars. In accordance with various embodiments, the laser cavity 105 and/or the resonator 100 may be partially or completely sealed via, e.g., one or more o-rings, gaskets, metal seals, and/or epoxy. In various embodiments, the laser cavity 105 and/or the resonator 100 may be partially or completely sealed via welding and/or brazing of all or a portion of an outer edge or perimeter thereof. In various embodiments, the seal may be hermetic, and thus prevent the flow of air or other gaseous species through the seal. In other embodiments, the seal is not hermetic. (As utilized herein, "sealed" means that the cavity, resonator, or region is isolated, hermetically or non-hermetically, from the surrounding ambient and from other portions of the resonator or system.) FIG. 1B schematically depicts a laser system 115 in which gas (e.g., air, nitrogen, or an inert gas such as argon) is supplied to resonator 100 and a siloxane-mitigation system 120 in a closed loop. As shown, a pump 125 pumps gas through the siloxane-mitigation system 120 and thence to the resonator 100 via a gas inlet 130. (In embodiments described herein in which the gas is not air, the pump may be fluidly coupled to a gas source containing the desired gas, e.g., one or more cylinders or other containers, or to a "house" source of gas.) The gas flows and/or circulates within the laser cavity 105 of the resonator 100 before being pumped back to pump 125 via a gas outlet 135. As shown, system 115 may also incorporate an optional desiccant 140 that removes moisture from the flowing gas. Although FIG. 1B depicts the desiccant 140 as being positioned upstream of the siloxane-mitigation system 120, in various embodiments the desiccant 140 may be positioned downstream of the siloxane-mitigation system 120 (and upstream of resonator 100) or even downstream of resonator 100 (and upstream of pump 125). In various embodiments, the desiccant 140 may include, consist essentially of, or consist of one or more materials such as calcium sulfate, silica, silica gel, activated charcoal, or a molecular sieve. In FIG. 1B and other figures, the gas flows represented by arrows may be physically supplied via one or more conduits (e.g., pipes, tubing, etc.) extending between the various system components.

In various embodiments, the use of desiccant 140 alone (and/or systems and techniques designed for moisture removal) is insufficient to reduce siloxane concentration within resonator 100 to levels adequately low to ensure high-reliability operation. While the removal of moisture from gas within and/or supplied to resonator 100 may have additional beneficial effects, such removal is generally insufficient to adequately address siloxane-induced issues detailed herein.

The operation of all or a portion of system 115 (e.g., pump 125 and/or siloxane-mitigation system 120) may be controlled by a controller 145. For example, the controller 145 may operate the pump 125 at intervals, which may be irregularly or regularly scheduled, or the controller 145 may operate the pump 125 on demand (e.g., when initiated by an operator). In other embodiments, the controller 145 operates the pump 125 continuously (e.g., during operation of the resonator 100 and/or the beam emitters 110 therewithin, and/or when the resonator 100 and/or the beam emitters 110 are not powered or being operated). In various embodiments, the controller 145 may be responsive to one or more monitors or sensors for sensing siloxane concentration, and may therefore operate pump 125 when the siloxane concentration reaches a threshold level. In various embodiments, the controller 145 may even power down or power off resonator 100 (and/or one or more beam emitters 110) when sensed siloxane concentration within the resonator 100 reaches a threshold level. Such monitors or sensors may be positioned at various locations within system 115, e.g., within the laser cavity 105, and/or within one or more conduits constituting the gas-flow path indicated in FIG. 1B. Exemplary siloxane sensors may include, but are not limited to, gas chromatography systems, mass spectrometers, and/or atomic emission detectors. In various embodiments, one or more sensors may be utilized to sense the concentration of siloxanes present in one or more components, within one or more conduits coupled to one or more components, and/or to an exhaust stream from one or more components, and such sensed concentrations may be reported (e.g., via a display). This information may be utilized to track the siloxane-mitigation performance of the system, and/or may be utilized as an indicator for, for example, replacement of consumables (e.g., siloxanes adsorbers or absorbers) within the system when the reported levels reach a threshold level.

The controller 145 may be provided as either software, hardware, or some combination thereof. For example, the system may be implemented on one or more conventional server-class computers, such as a PC having a CPU board containing one or more processors such as the Pentium or Celeron family of processors manufactured by Intel Corporation of Santa Clara, Calif., the 680x0 and POWER PC family of processors manufactured by Motorola Corporation of Schaumburg, Ill., and/or the ATHLON line of processors manufactured by Advanced Micro Devices, Inc., of Sunnyvale, Calif. The processor may also include a main memory unit for storing programs and/or data relating to the methods described herein. The memory may include random access memory (RAM), read only memory (ROM), and/or FLASH memory residing on commonly available hardware such as one or more application specific integrated circuits (ASIC), field programmable gate arrays (FPGA), electrically erasable programmable read-only memories (EEPROM), programmable read-only memories (PROM), programmable logic devices (PLD), or read-only memory devices (ROM). In some embodiments, the programs may be provided using external RAM and/or ROM such as optical disks, magnetic disks, as well as other commonly used storage devices. For embodiments in which the functions are provided as one or more software programs, the programs may be written in any of a number of high level languages such as FORTRAN, PASCAL, JAVA, C, C++, C#, BASIC, various scripting languages, and/or HTML. Additionally, the software may be implemented in an assembly language directed to the microprocessor resident on a target computer; for example, the software may be implemented in Intel 80×86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM.

In various embodiments, the siloxane-mitigation system 120 may include, consist essentially of, or consist of a material for adsorption of the siloxane from the gas stream, such as activated carbon, silica gel, polymer beads, or one or more molecular sieves. In addition or instead, the siloxane-mitigation system 120 may include, consist essentially of, or consist of a material (e.g., a liquid) for absorption of the siloxane from the gas stream, such as one or more organic solvents, mineral oil, or even water. In the siloxane-mitigation system 120, the gas to be pumped into the laser cavity 105 may flow over and/or through (e.g., bubbled through) one or more such materials for adsorption and/or absorption of siloxanes from the gas.

In some embodiments, the siloxane-mitigation system 120 may alternatively, or in addition, include, consist essentially of, or consist of a remediation system that removes siloxane from the gas stream via condensation (e.g., one or more cooling systems) and/or reaction (such as catalysis). For example, for condensation, the siloxane-mitigation system 120 may include, consist essentially of, or consist of a device or material producing sufficiently low temperature and/or pressure to condense at least a portion of the siloxanes from the gas. For example, the siloxane-mitigation system 120 may include, consist essentially of, or consist of a refrigeration system and/or heat exchanger to cool the gas to a temperature below approximately 5° C. (for, e.g., removal of about 15%-50% of the siloxanes), or even below approximately −25° C. or −30° C. (for, e.g., removal of about 95% or more of the siloxanes). Catalytic systems in accordance with embodiments of the invention may include, consist essentially of, or consist of a material such as activated alumina (and/or one or more other porous and/or ceramic materials) for reaction (and thus removal) of the siloxanes from the gas; such catalyst materials may be replenished one or more times during and/or after operation of the laser system.

Figure 1C:
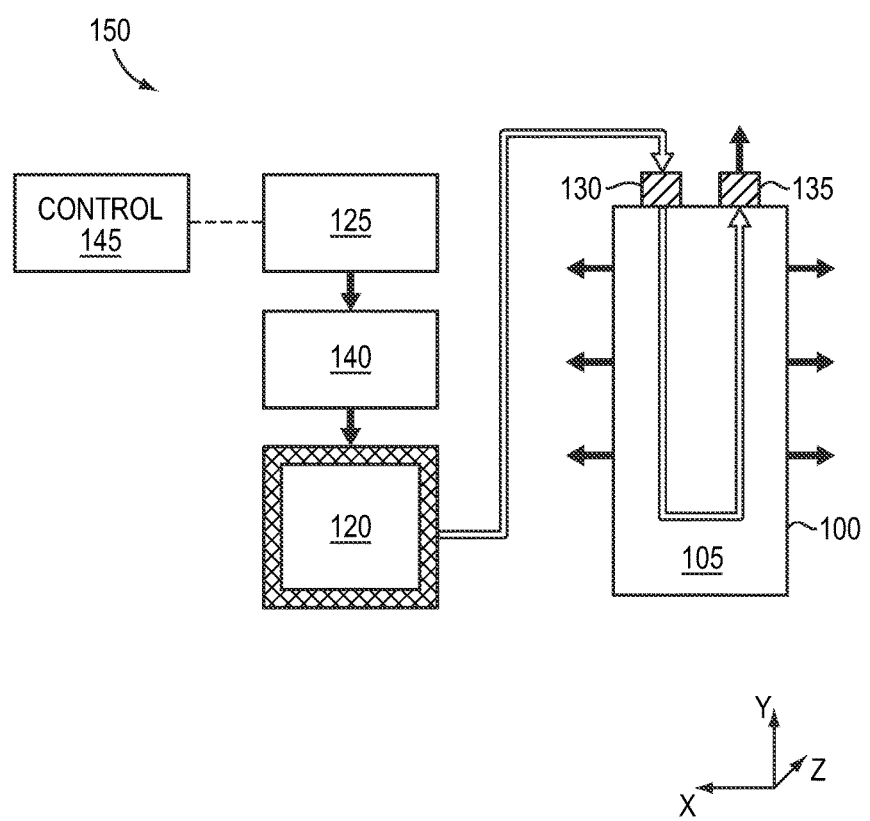

FIG. 1C schematically depicts a laser system 150 in which gas (e.g., air, nitrogen, and/or one or more inert gases such as argon) is supplied to resonator 100 via siloxane-mitigation system 120 in an open loop. As shown, the gas is pumped using pump 125, via optional desiccant 140 and siloxane-mitigation system 120, into the laser cavity 105 of resonator 100 via gas inlet 130. In this manner, a positive pressure is formed within the laser cavity 105, and gas may escape from the laser cavity 105 via gas outlet 135 and be released into the surrounding ambient or into an exhaust system. In various embodiments, particularly when the laser cavity 105 is not hermetically sealed, gas may escape (e.g., leak) from the laser cavity 105 through seals and/or walls or other surfaces of the resonator 100 itself, in addition to (or even instead of) leaving the laser cavity via gas outlet 135. In some such embodiments, therefore, gas outlet 135 may not be present.

Figure 2:
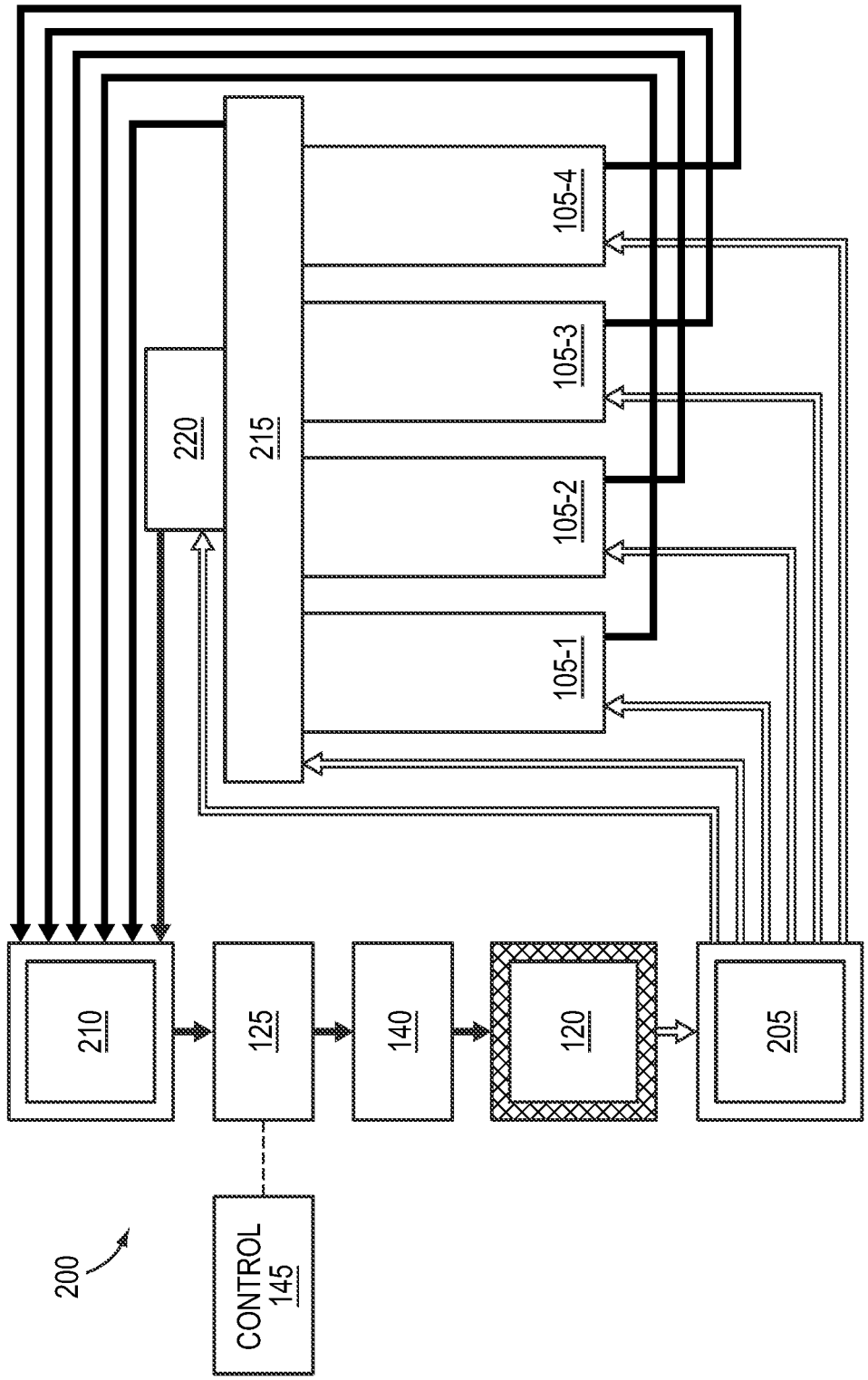
FIGS. 2 and 3 are schematic diagrams of laser systems in accordance with embodiments of the present invention.

FIG. 2 schematically depicts a laser system 200 in which gas (e.g., air, nitrogen, and/or one or more inert gases such as argon) is supplied to multiple different system components via siloxane-mitigation system 120 in parallel. That is, as shown, the gas flows into and out of each of the various components via a dedicated path (e.g., via a dedicated gas inlet, gas outlet, and conduits), and gas is not directly exchanged between multiple components. One or more pumps 125 may control the flow of gas, which may travel from the siloxane-mitigation system 120 to the various system components via an inlet manifold 205. Inlet manifold 205 receives the treated gas from the siloxane-mitigation system 120 and supplies it, via multiple different outlets, to the various system components. The gas then flows from each component, via a gas outlet thereon (e.g., gas outlet 135 on FIGS. 1B and 1C) to an outlet manifold 210. Outlet manifold 210 receives the various gas flows, combines them, and supplies the gas back to pump 125 via a gas outlet.

In various embodiments of the invention, system 200 may be applied to multiple components within a single resonator 100 or to multiple different resonators 100 (and/or components thereof). For example, as shown in FIG. 2, treated gas is supplied to multiple different laser cavities 105-1-105-4, each of which may be disposed within a different resonator 100. The laser cavities may be optically interfaced with (i.e., supply laser beams to) one or more additional components such as a beam-combining module 215 and/or a fiber optic module 220. In exemplary embodiments, beam-combining module 215 may contain one or more optical elements, such as mirrors, dichroic mirrors, lenses, prisms, dispersive elements, polarization beam combiners, etc., that may combine beams received from the various laser cavities into one or more output beams. In various embodiments, the fiber-optic module may contain, for example, one or more optical elements for adjusting output laser beams, as well as interface hardware connecting to one or more optical fibers for coupling of the beams into the optical fiber(s).

Figure 3:
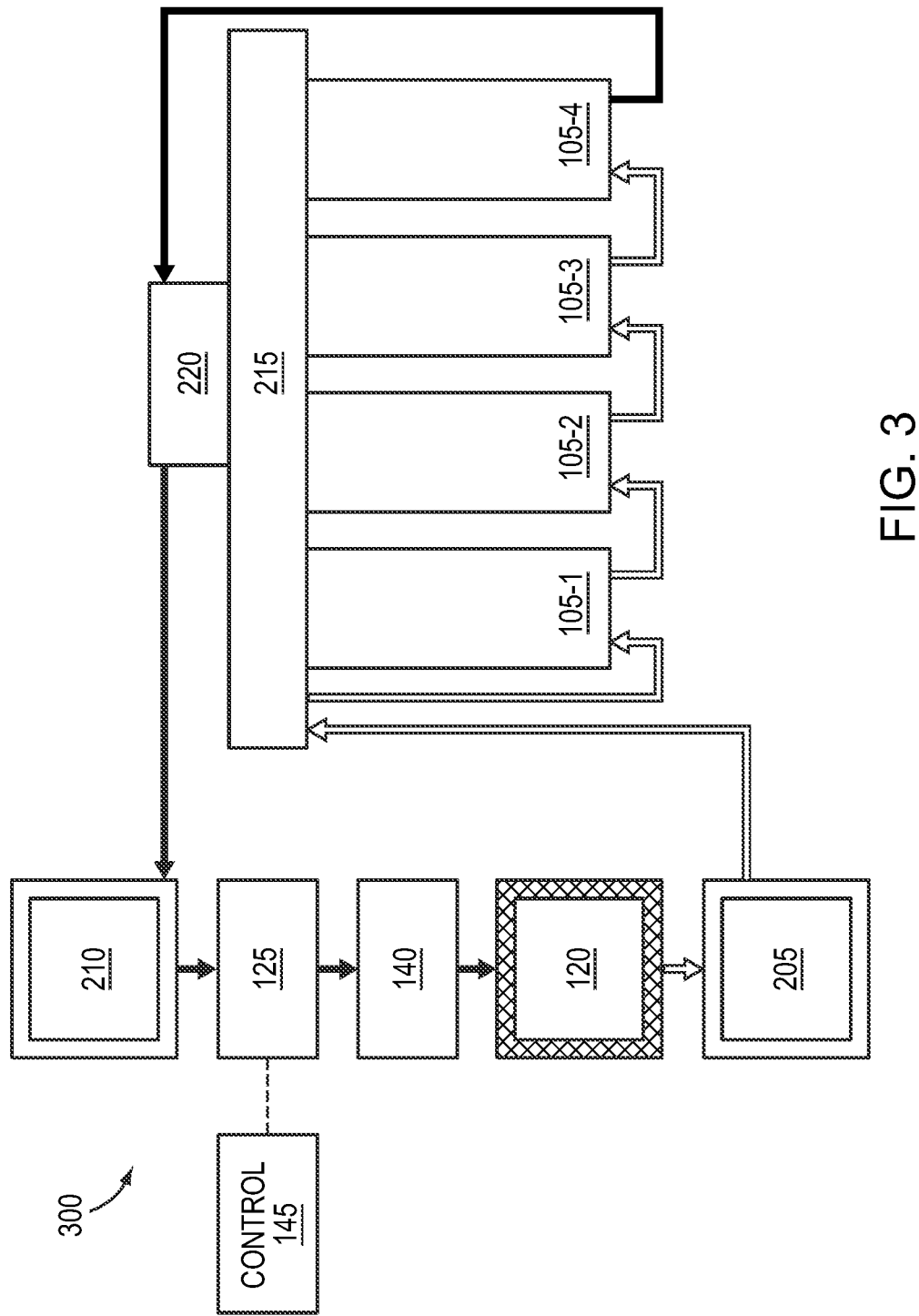

FIG. 3 schematically depicts a laser system 300 in which gas (e.g., air, nitrogen, and/or one or more inert gases such as argon) is supplied to multiple different system components via siloxane-mitigation system 120 in series. That is, as shown, the gas flows along a single path that extends into a first component (e.g., beam-combining module 215 as shown), out of that component and into the next component (e.g., laser cavity 105-1 as shown), and so forth, until the gas is finally exhausted from the final component in the series (e.g., fiber optic module 220 as shown) back to outlet manifold 210 for supply back to pump 125. Thus, in the technique illustrated in FIG. 3, gas is introduced into each of the various components at different times, and sequentially, whereas in the parallel arrangement depicted in FIG. 2, gas is introduced into (or at least flowed to) each of the components substantially simultaneously (depending upon the various lengths of the conduits coupled to each of the components). Laser system 300 requires fewer conduits and connections when compared to laser system 200, although different components along the gas-flow path may receive gas having different levels of purity (e.g., different levels of remnant siloxanes) in some embodiments.

Although only one siloxane-mitigation system 120 is depicted in FIG. 3, embodiments of the invention may include one or more additional siloxane-mitigation systems disposed between two of the components, in order to ensure that gas flowing sequentially through all of the various components maintains a low concentration of siloxanes. In embodiments featuring only one siloxane-mitigation system 120 as depicted in FIG. 3, the siloxane-mitigation system 120 may be disposed upstream of all of the components, as shown, or may be disposed between two of the components or downstream of the last component and upstream of the pump 125.

Figure 4:
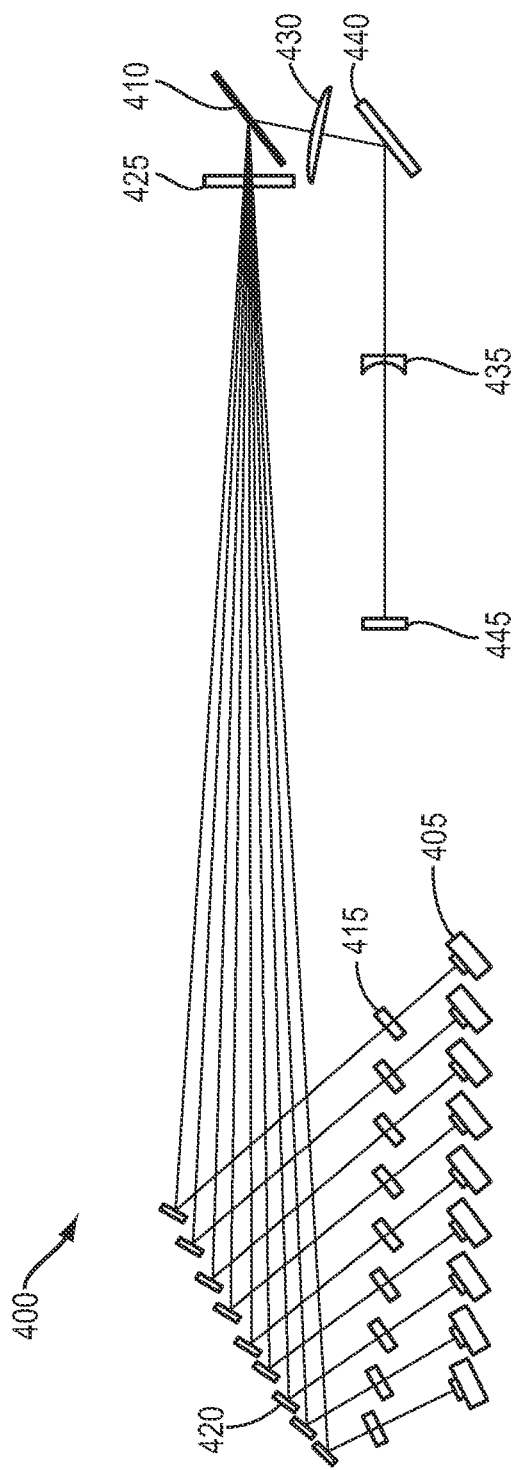
FIG. 4 is a schematic diagram of a wavelength beam combining (WBC) resonator in accordance with embodiments of the present invention.

Laser systems in accordance with embodiments of the present invention may utilize WBC technology and may therefore include WBC laser systems and related components. FIG. 4 schematically depicts various components of a WBC resonator 400 that, in the depicted embodiment, combines the beams emitted by nine different multi-beam emitters, i.e., emitters from which multiple beams are emitted from a single package, such as diode bars. Embodiments of the invention may be utilized with fewer or more than nine emitters. In accordance with embodiments of the invention, each emitter may emit a single beam, or, each of the emitters may emit multiple beams. The emitters in FIG. 4 are depicted as each emitting a single beam for clarity and convenience of illustration. The view of FIG. 4 is along the WBC dimension, i.e., the dimension in which the beams from the bars are combined. The exemplary resonator 400 features nine diode bars 405, and each diode bar 405 includes, consists essentially of, or consists of an array (e.g., one-dimensional array) of emitters along the WBC dimension. Each emitter of a diode bar 405 may emit a non-symmetrical beam having a larger divergence in one direction (known as the "fast axis," here oriented vertically relative to the WBC dimension) and a smaller divergence in the perpendicular direction (known as the "slow axis," here along the WBC dimension).

In various embodiments, each of the diode bars 405 is associated with (e.g., attached or otherwise optically coupled to) a fast-axis collimator (FAC)/optical twister microlens assembly that collimates the fast axis of the emitted beams while rotating the fast and slow axes of the beams by 90°, such that the slow axis of each emitted beam is perpendicular to the WBC dimension downstream of the microlens assembly. The microlens assembly also converges the chief rays of the emitters from each diode bar 405 toward a dispersive element 410. Suitable microlens assemblies are described in U.S. Pat. No. 8,553,327, filed on Mar. 7, 2011, and U.S. Pat. No. 9,746,679, filed on Jun. 8, 2015, the entire disclosure of each of which is hereby incorporated by reference herein.

As shown in FIG. 4, resonator 400 also features a set of SAC lenses (or "slow-axis collimators") 415, one SAC lens 415 associated with, and receiving beams from, one of the diode bars 405. Each of the SAC lenses 415 collimates the slow axes of the beams emitted from a single diode bar 405. After collimation in the slow axis by the SAC lenses 415, the beams propagate to a set of interleaving mirrors 420, which redirect the beams toward the dispersive element 410. The arrangement of the interleaving mirrors 420 enables the free space between the diode bars 405 to be reduced or minimized, and also reduces or minimizes the overall wavelength locking bandwidth. Upstream of the dispersive element 410 (which may include, consist essentially of, or consist of, for example, a diffraction grating such as the transmissive diffraction grating depicted in FIG. 4), a lens 425 may optionally be utilized to collimate the sub-beams (i.e., emitted rays other than the chief rays) from the diode bars 405. In various embodiments, the lens 425 is disposed at an optical distance away from the diode bars 405 that is substantially equal to the focal length of the lens 425. Note that, in various embodiments, the overlap of the chief rays at the dispersive element 410 is primarily due to the redirection of the interleaving mirrors 420, rather than the focusing power of the lens 425.

Also depicted in FIG. 4 are lenses 430, 435, which form an optical telescope for mitigation of optical cross-talk, as disclosed in U.S. Pat. No. 9,256,073, filed on Mar. 15, 2013, and U.S. Pat. No. 9,268,142, filed on Jun. 23, 2015, the entire disclosure of which is hereby incorporated by reference herein. Resonator 400 may also include one or more folding mirrors 440 for redirection of the beams such that the resonator 400 may fit within a smaller physical footprint. The dispersive element 410 combines the beams from the diode bars 405 into a single, multi-wavelength beam, which propagates to a partially reflective output coupler 445. The coupler 445 transmits a portion of the beam as the output beam of resonator 400 while reflecting another portion of the beam back to the dispersive element 410 and thence to the diode bars 405 as feedback to stabilize the emission wavelengths of each of the beams.

As shown in FIGS. 2 and 3, in various embodiments of the invention, a laser system incorporates multiple resonators 400, and the output beams from the resonators 400 are combined downstream (e.g., within a housing and/or by one or more optical elements; for example, in beam-combining module 215) into a single output beam that may be directed to a workpiece for processing (e.g., welding, cutting, annealing, etc.) and/or coupled into an optical fiber (e.g., via fiber optic module 220).

Figure 5A:
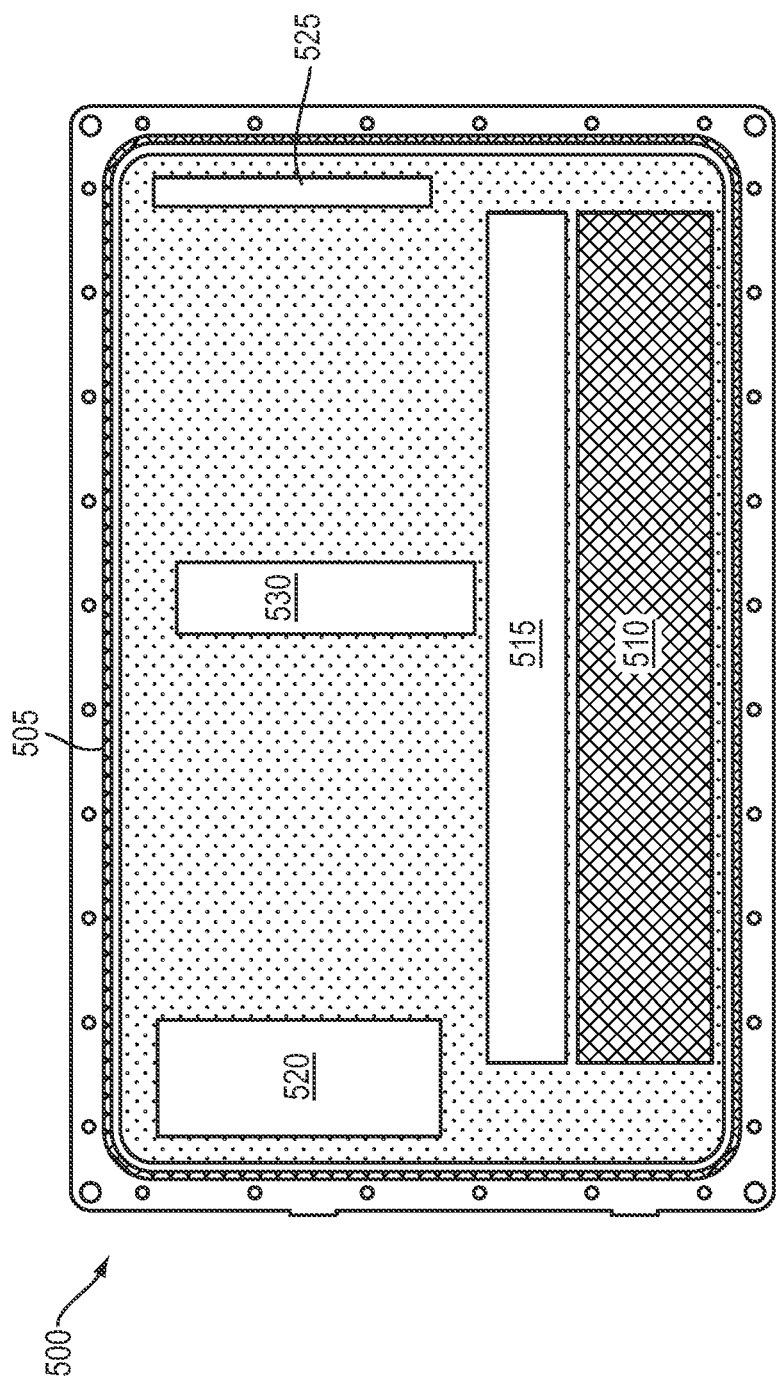
FIG. 5A is a schematic view of a first side of a laser resonator in accordance with various embodiments of the present invention.
Figure 5B:
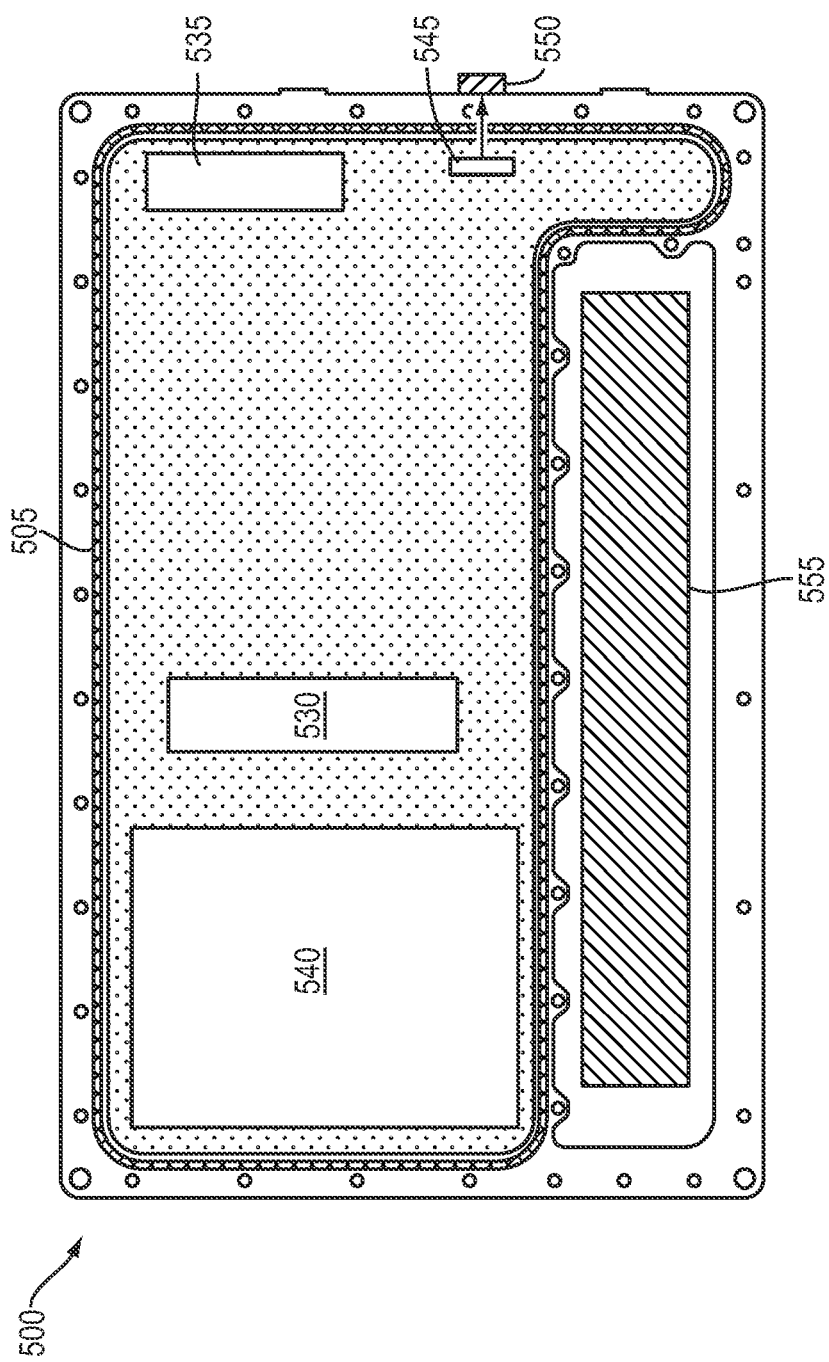
FIG. 5B is a schematic view of a second side of a laser resonator in accordance with various embodiments of the present invention.

Various embodiments of the invention implement an external cavity laser system and reduce the required size of the resonator using a laser cavity that extends along opposing sides of the resonator. FIGS. 5A and 5B depict opposing sides of a resonator 500 that collectively constitute a single laser cavity (connected by a central opening, as detailed below). In accordance with embodiments of the invention, both sides of resonator 500 may be sealed, e.g., along a sealing path 505, and gas may flow into and out of the laser cavity via a gas inlet and a gas outlet (not shown in FIGS. 5A and 5B; see FIGS. 1A-1C). For example, a solid cover plate may be sealed over each side of the resonator 500 along the sealing paths 505 to seal the laser cavity within the resonator 500. In various embodiments, each cover plate may be fastened and/or sealed to resonator 500 via fasteners (e.g., screws, bolts, rivets, etc.) that extend into (and may mechanically engage with, e.g., threadingly engage with) apertures defined in resonator 500. In other embodiments, each cover plate may be sealed along its sealing path 505 via a technique such as welding, brazing, or use of an adhesive material.

In various embodiments, the gas inlet and outlet for flow of gas into and out of the laser cavity of resonator 500 may be disposed on one or both of the cover plates sealed to the resonator 500 along the sealing paths 505. Reflectors such as mirrors may be utilized to direct the beams from one or more beam emitters within the laser cavity, and, since the laser cavity extends along both sides, the overall size of the resonator 500 may be correspondingly reduced for the same cavity size (e.g., compared to a resonator having an optical cavity on only one side).

In the exemplary embodiment shown in FIGS. 5A and 5B, beams from beam emitters (e.g., beam emitters 405 shown in FIG. 4) disposed in mounting area 510 may be focused by a group of lenses (and/or other optical elements; for example, SAC lenses 415 shown in FIG. 4) disposed in lens area 515 toward a group of mirrors (e.g., interleaving mirrors 420 shown in FIG. 4) in a mirror area 520. From mirror area 520, the beams from the beam emitters may be directed to another mirror area 525 (containing multiple reflectors such as mirrors) and thence through an opening 530 to the remaining portion of the laser cavity on the other side of resonator 500. As shown in FIG. 5B, the beams may be directed to a mirror area 535 (containing multiple reflectors such as mirrors), which reflects the beams to a beam-combining area 540. In example embodiments, the beam-combining area 540 may include therewithin the diffusive element 410 (and, in some embodiments, the output coupler 445) shown in FIG. 4. In various embodiments, the beams each have a different wavelength, and the beams are combined in beam-combining area 540 into an output beam composed of the multiple wavelengths. The beam from the beam-combining area 540 may be directed to a mirror 545 (which, in various embodiments, may be partially reflective output coupler 445) and thence to an output 550 for emission from the resonator 500. For example, the output may be a window for emission of the beam therethrough or an optical coupler configured to connect to an optical fiber. In various embodiments, the output may transmit the beam to a fiber-optic module (e.g., fiber optic module 220) for coupling into an optical fiber. In other embodiments, the output beam may be transmitted to a beam-combining module (see, e.g., FIG. 2), and combined with output beams emitted by other resonators. The resulting combined beam may be transmitted to a fiber-optic module (e.g., fiber optic module 220) for coupling into an optical fiber, and/or utilized for processing of a workpiece.

As shown in FIG. 5B, resonator 500 may also include a liquid coolant cavity 555. The liquid coolant cavity 555 is, in various embodiments, a hollow cavity configured to contain liquid coolant (e.g., water, glycol, or other heat-transfer fluid) directly beneath the mounting area 510. The liquid coolant may flow into and out of the cavity 555 via a fluid inlet and a fluid outlet (not shown), which may be fluidly coupled to, e.g., a reservoir of coolant and/or a heat exchanger for cooling fluid heated by the beam emitters. As detailed in the '134 application, embodiments of the invention may feature a control system that controls the rate of fluid flow into and out of the cavity 555 based on one or more sensed characteristics, e.g., temperature of the beam emitters, the cooling fluid, and/or one or more other components of and/or positions within resonator 500. In various embodiments, the laser cavity of resonator 500 may be sealed without sealing or covering of the optical coolant cavity 555, thereby leaving the optical coolant cavity 555 accessible (e.g., for service, maintenance, or cleaning) without the need to unseal or expose the more delicate components disposed within the laser cavity.

Figure 6:
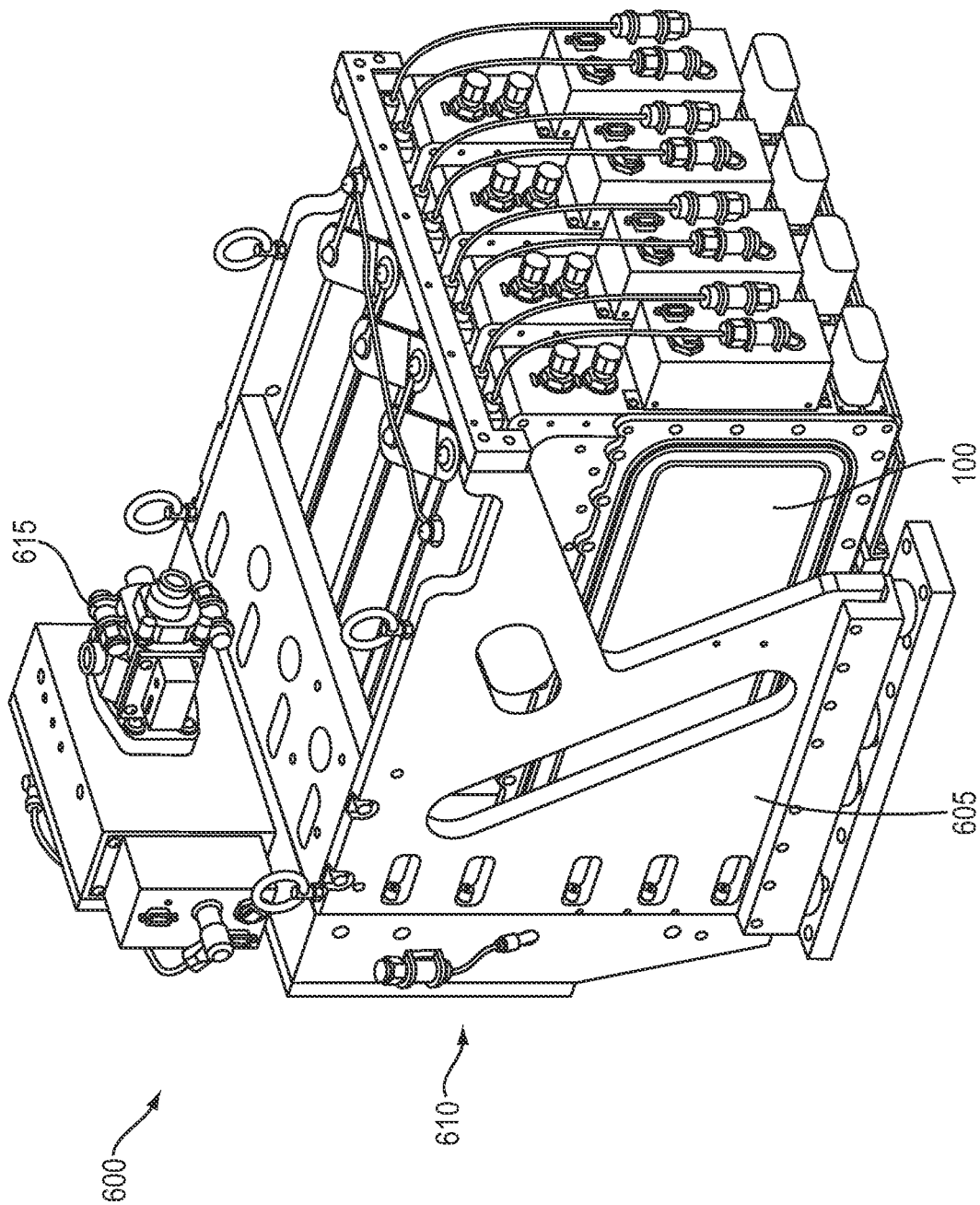
FIG. 6 is a perspective view of a laser engine incorporating multiple laser resonators in accordance with various embodiments of the present invention.

In various embodiments of the invention, a laser system incorporates multiple resonators 100, as shown in FIGS. 2 and 3, and the output beams from the resonators 100 are combined downstream (e.g., within a master housing and/or by one or more optical elements) into a single output beam that may be directed to a workpiece for processing (e.g., welding, cutting, annealing, etc.) and/or coupled into an optical fiber. For example, FIG. 6 depicts an exemplary laser system (or "laser engine") 600 in accordance with embodiments of the invention. In laser system 600, multiple laser resonators 100 are mounted within a master housing 605, and the output beams from the resonators 100 are emitted into a beam-combining module 610 and thence to a fiber optic module 615. In exemplary embodiments, beam-combining module 610 may contain one or more optical elements, such as mirrors, dichroic mirrors, lenses, prisms, dispersive elements, polarization beam combiners, etc., that may combine beams received from the various resonators into one or more output beams. In various embodiments, the fiber-optic module 615 may contain, for example, one or more optical elements for adjusting output laser beams, as well as interface hardware connecting to one or more optical fibers for coupling of the beams into the optical fiber(s). While laser engine 600 is depicted as including four resonators 100, laser engines in accordance with embodiments of the invention may include one, two, three, or five or more laser resonators. Various components of siloxane-mitigation systems as described herein are not shown in FIG. 6 for clarity but are illustrated schematically in FIGS. 2 and 3. In various embodiments of the invention, an open-loop or closed loop siloxane-mitigation system utilized to reduce or minimize the concentration of siloxanes within a resonator 100 may be shared (e.g., in parallel or in series) with other resonators in a laser engine and/or with other components of the laser engine such as the beam-combining module and/or fiber optic module.

As mentioned herein, in various embodiments of the present invention, the output beams of the laser systems or laser resonators may be propagated, e.g., via a fiber optic module, to a delivery optical fiber (which may be coupled to a laser delivery head) and/or utilized to process a workpiece. In various embodiments, a laser head contains one or more optical elements utilized to focus the output beam onto a workpiece for processing thereof. For example, laser heads in accordance with embodiments of the invention may include one or more collimators (i.e., collimating lenses) and/or focusing optics (e.g., one or more focusing lenses). A laser head may not include a collimator if the beam(s) entering the laser head are already collimated. Laser heads in accordance with various embodiments may also include one or more protective window, a focus-adjustment mechanism (manual or automatic, e.g., one or more dials and/or switches and/or selection buttons). Laser heads may also include one or more monitoring systems for, e.g., laser power, target material temperature and/or reflectivity, plasma spectrum, etc. A laser head may also include optical elements for beam shaping and/or adjustment of beam quality (e.g., variable BPP) and may also include control systems for polarization of the beam and/or the trajectory of the focusing spot. In various embodiments, the laser head may include one or more optical elements (e.g., lenses) and a lens manipulation system for selection and/or positioning thereof for, e.g., alteration of beam shape and/or BPP of the output beam, as detailed in U.S. patent application Ser. No. 15/188,076, filed on Jun. 21, 2016, the entire disclosure of which is incorporated by reference herein. Exemplary processes include cutting, piercing, welding, brazing, annealing, etc. The output beam may be translated relative to the workpiece (e.g., via translation of the beam and/or the workpiece) to traverse a processing path on or across at least a portion of the workpiece.

In embodiments utilizing an optical delivery fiber, the optical fiber may have many different internal configurations and geometries. For example, the optical fiber may include, consist essentially of, or consist of a central core region and an annular core region separated by an inner cladding layer. One or more outer cladding layers may be disposed around the annular core region. Embodiments of the invention may incorporate optical fibers having configurations described in U.S. patent application Ser. No. 15/479,745, filed on Apr. 5, 2017, and U.S. patent application Ser. No. 16/675,655, filed on Nov. 6, 2019, the entire disclosure of each of which is incorporated by reference herein.

In various embodiments, the controller may control the motion of the laser head or output beam relative to the workpiece via control of, e.g., one or more actuators. The controller may also operate a conventional positioning system configured to cause relative movement between the output laser beam and the workpiece being processed. For example, the positioning system may be any controllable optical, mechanical or opto-mechanical system for directing the beam through a processing path along a two- or three-dimensional workpiece. During processing, the controller may operate the positioning system and the laser system so that the laser beam traverses a processing path along the workpiece. The processing path may be provided by a user and stored in an onboard or remote memory, which may also store parameters relating to the type of processing (cutting, welding, etc.) and the beam parameters necessary to carry out that processing. The stored values may include, for example, beam wavelengths, beam shapes, beam polarizations, etc., suitable for various processes of the material (e.g., piercing, cutting, welding, etc.), the type of processing, and/or the geometry of the processing path.

As is well understood in the plotting and scanning art, the requisite relative motion between the output beam and the workpiece may be produced by optical deflection of the beam using a movable mirror, physical movement of the laser using a gantry, lead-screw or other arrangement, and/or a mechanical arrangement for moving the workpiece rather than (or in addition to) the beam. The controller may, in some embodiments, receive feedback regarding the position and/or processing efficacy of the beam relative to the workpiece from a feedback unit, which will be connected to suitable monitoring sensors.

In addition, the laser system may incorporate one or more systems for detecting the thickness of the workpiece and/or heights of features thereon. For example, the laser system may incorporate systems (or components thereof) for interferometric depth measurement of the workpiece, as detailed in U.S. patent application Ser. No. 14/676,070, filed on Apr. 1, 2015, the entire disclosure of which is incorporated by reference herein. Such depth or thickness information may be utilized by the controller to control the output beam to optimize the processing (e.g., cutting, piercing, or welding) of the workpiece, e.g., in accordance with records in the database corresponding to the type of material being processed.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

The invention claimed is:

1. A laser apparatus comprising:
a laser system comprising a plurality of enclosed components, at least one of the components comprising one or more beam emitters therewithin;
a plurality of gas inlets, each gas inlet being configured to permit ingress of gas into a different one of the enclosed components of the laser system;
an inlet manifold, different from the plurality of enclosed components, fluidly coupled to the plurality of gas inlets;
a pump, different from the plurality of enclosed components, for supplying gas to the inlet manifold; and
a siloxane-mitigation system, different from the plurality of enclosed components, configured to remove siloxanes from gas supplied to the inlet manifold by the pump.

2. The apparatus of claim 1, wherein at least one of the enclosed components of the laser system is configured to allow leakage of the supplied gas therefrom into a surrounding ambient without a dedicated gas outlet.

3. The apparatus of claim 1, further comprising a plurality of gas outlets, each gas outlet being configured to permit egress of gas from a different one of the enclosed components of the laser system.

4. The apparatus of claim 3, further comprising an outlet manifold fluidly coupled to the plurality of gas outlets.

5. The apparatus of claim 4, wherein at least one of the enclosed components of the laser system lacks a gas outlet fluidly coupled to the outlet manifold.

6. The apparatus of claim 4, wherein the pump is fluidly connected to the outlet manifold.

7. The apparatus of claim 4, wherein the outlet manifold is configured to release gas into a surrounding ambient.

8. The apparatus of claim 3, wherein at least one of the gas outlets is configured to release gas into a surrounding ambient.

9. The apparatus of claim 1, wherein at least one of the enclosed components of the laser system (i) comprises therewithin one or more optical elements configured to focus and/or direct laser beams, and (ii) does not comprise a beam emitter therewithin.

10. The apparatus of claim 1, further comprising one or more sensors configured to detect siloxanes within at least one component and/or within one or more conduits fluidly connected to at least one of the pump, at least one component, the inlet manifold, or the siloxane-mitigation system.

11. The apparatus of claim 1, further comprising a computer-based controller configured to introduce gas into the inlet manifold via operation of the pump.

12. The apparatus of claim 11, further comprising one or more sensors configured to detect siloxanes within at least one component and/or within one or more conduits fluidly connected to at least one of the pump, at least one component, the inlet manifold, or the siloxane-mitigation system, wherein the controller is responsive to signals received from the one or more sensors.

13. The apparatus of claim 12, wherein the controller is configured to introduce gas into the inlet manifold only when a siloxane concentration detected by at least one of the sensors exceeds a threshold.

14. The apparatus of claim 11, wherein the controller is configured to introduce gas into the inlet manifold continuously, at least during operation of the one or more beam emitters.

15. The apparatus of claim 11, wherein the controller is configured to introduce gas into the inlet manifold at regular intervals, irrespective of a siloxane concentration within one or more of the components.

16. The apparatus of claim 11, wherein the controller is configured to power down or power off the one or more beam emitters when a siloxane concentration detected by at least one of the sensors exceeds a threshold.

17. The apparatus of claim 1, wherein one of the components comprises a laser resonator having an enclosed laser cavity, the laser cavity comprising therewithin:
a plurality of beam emitters each emitting a beam having a different wavelength;

a dispersive element configured to receive beams emitted by the plurality of emitters and combine the beams into a multi-wavelength beam; and disposed optically downstream of the dispersive element, a partially reflective output coupler configured to (i) receive the multi-wavelength beam, (ii) transmit a first portion of the multi-wavelength beam as an output beam, and (iii) reflect a second portion of the multi-wavelength beam back toward the dispersive element.

18. The apparatus of claim 17, wherein:

the laser cavity comprises a platform having top and bottom opposed sides and defining an opening therethrough;

the plurality of beam emitters is disposed over the top side of the platform, the beams emitted thereby being directed through the opening in the platform to the bottom side of the platform; and the dispersive element is disposed over the bottom side of the platform and positioned to receive the beams directed through the opening.

19. The apparatus of claim 18, wherein the partially reflective output coupler is disposed over the bottom side of the platform.

20. The apparatus of claim 17, wherein the laser cavity comprises therewithin:

a plurality of slow-axis collimation lenses disposed optically downstream of the plurality of beam emitters, each slow-axis collimation lens configured to receive one or more beams from one of the beam emitters; and a plurality of folding mirrors disposed optically downstream of the slow-axis collimation lenses and optically upstream of the dispersive element.

21. The apparatus of claim 20, wherein:

the laser cavity comprises a platform having top and bottom opposed sides;

the plurality of beam emitters is disposed over the top side of the platform;

the plurality of slow-axis collimation lenses and the plurality of folding mirrors are disposed over the top side of the platform;

the dispersive element is disposed over the bottom side of the platform;

the platform defines an opening therethrough, and the beams emitted by the plurality of beam emitters are directed, from the top side of the platform to the bottom side of the platform, to the dispersive element through the opening; and the partially reflective output coupler is disposed over the bottom side of the platform.

22. The apparatus of claim 1, wherein the plurality of enclosed components of the laser system comprises a plurality of laser resonators, each laser resonator (i) being enclosed within a separate enclosure fluidly coupled to a different one of the gas inlets and (ii) comprising a plurality of beam emitters therewithin and being configured to combine beams emitted by the beam emitters into a combined beam.

23. The apparatus of claim 22, further comprising:

a beam-combining module, separate from the laser resonators, configured to receive the combined beams from the laser resonators and combine the combined beams into an output beam; and a fiber optic module, separate from the laser resonators, configured to receive the output beam from the beam-combining module and supply the output beam to an optical fiber.

24. The apparatus of claim 1, further comprising a desiccant positioned to remove moisture from gas supplied to the inlet manifold by the pump.

25. The apparatus of claim 1, wherein the siloxane-mitigation system comprises a siloxane-adsorbing material and/or a siloxane-absorbing material.

26. The apparatus of claim 1, wherein the siloxane-mitigation system comprises a remediation system configured to remove siloxanes from the gas via at least one of condensation or reaction.

27. The apparatus of claim 1, wherein the siloxane-mitigation system comprises a liquid over and/or through which gas supplied to the inlet manifold is flowed.

28. The apparatus of claim 22, wherein at least one of (i) one of the gas inlets is configured to permit ingress of gas into the beam-combining module, or (ii) one of the gas inlets is configured to permit ingress of gas into the fiber optic module.

* * * * *